United States Patent [19]

Kosuge et al.

[11] Patent Number: 5,061,685
[45] Date of Patent: Oct. 29, 1991

[54] MAGNETIC SHIELD

[75] Inventors: Shigeyoshi Kosuge; Makoto Kabasawa; Moriaki Ono; Yukio Shinbo, all of Tokyo, Japan

[73] Assignee: Kitagawa Industries Co., Ltd., Nagoya, Japan

[21] Appl. No.: 640,693

[22] Filed: Jan. 14, 1991

[30] Foreign Application Priority Data

Jan. 25, 1990 [JP] Japan .................................. 2-15564

[51] Int. Cl.$^5$ .......................... H04B 3/28; H05K 9/00; H01L 39/00
[52] U.S. Cl. .......................... 505/1; 505/872; 307/91; 174/35 R
[58] Field of Search .................. 174/35 R, 35 MS; 307/91; 505/1, 843, 844, 845, 846, 872

[56] References Cited

U.S. PATENT DOCUMENTS

| | | | |
|---|---|---|---|
| 3,603,716 | 9/1971 | Koren | 174/35 MS |
| 3,895,432 | 7/1975 | Diepers et al. | 29/599 |
| 4,828,931 | 5/1989 | Ogawa et al. | 428/596 |

OTHER PUBLICATIONS

Shigematsu et al, "Magnetic Shield of High—Tc Oxide Superconductors at 77K", Japanese Journal of Applied Physics, vol. 28, No. 5, May 1989, pp. L813–L815.

Primary Examiner—Leo P. Picard
Assistant Examiner—Bot Lee Ledynh
Attorney, Agent, or Firm—Oliff & Berridge

[57] ABSTRACT

A magnetic shield which comprises: a plurality of metallic cylinders connected to each other in the axial direction thereof, each of the plurality of cylinders having at one end thereof an engaging section for receiving an end of an adjacent metallic cylinder to be connected thereto; and a film of a composite oxide superconducting material containing a $Cu_xO_y$-radical, formed on the entire inner surface of each of the plurality of cylinders, including the inner surface of the engaging section thereof. The above-mentioned magnetic shield can easily be scaled up and has a high magnetic shielding effect.

3 Claims, 1 Drawing Sheet

MAGNETIC SHIELD

REFERENCE TO PATENTS, APPLICATIONS AND PUBLICATIONS PERTINENT TO THE INVENTION

As far as we know, there is available the following prior art document pertinent to the present invention:

"Japanese Journal of Applied Physics" Vol. 28, No. 5, issued in May 1989, pp. L813-L815.

The contents of the prior art disclosed in the above-mentioned prior art document will be discussed hereafter under the heading of the "BACKGROUND OF THE INVENTION".

FIELD OF THE INVENTION

The present invention relates to a magnetic shield which can easily be scaled up and has a high magnetic shielding effect.

BACKGROUND OF THE INVENTION

In the field of measurement of bio-magnetism for diagnosing a patient on the basis of a feeble magnetism generated from a human body, and in the field of a magnetic prospecting for exploration of mineral resources on the basis of a feeble magnetism generated from rocks, for example, an external magnetism such as geomagnetism present in the environment of an object of magnetic detection and in the environment of a magnetic detector, and a leakage magnetism generated from various electrical appliances, forms a factor causing decrease in a detecting accuracy of such a feeble magnetism.

In order to improve the detecting accuracy of a feeble magnetism, therefore, it is necessary to magnetically shield the object of magnetic detection and the magnetic detector from the external environment by means of a magnetic shield so as to prevent the external magnetism from coming into the object of magnetic detection and the magnetic detector.

A magnetic shield is usually made of a ferromagnetic material such as iron or nickel. By covering the object of magnetic detection and the magnetic detector by means of the magnetic shield made of a ferromagnetic material, most of the external magnetism passes along the magnetic shield without coming into the space surrounded by the magnetic shield, in which the object of magnetic detection and the magnetic detector are placed. A feeble magnetism is therefore detected at a high accuracy without being affected by the external magnetism.

However, while the magnetic shield made of the ferromagnetic material is effective in reducing a relatively strong external magnetism to an intensity of the order of that of geomagnetism, the magnetic shield of this type gives only a poor magnetic shielding effect when it is necessary to largely reduce the intensity of the external magnetism as compared with that of geomagnetism, as in the case of measurement of a feeble magnetism such as bio-magnetism, because the magnetic shield made of the ferromagnetic material has a residual magnetism.

With a view to overcoming this inconvenience, "Japanese Journal of Applied Physics" Vol. 28, No. 5, issued in May 1989, pp. L813-L815 discloses a magnetic shield made of a superconducting material, as a magnetic shield capable of giving an excellent magnetic shielding effect (hereinafter referred to as the "prior art").

A magnetic shield of the above-mentioned prior art is manufactured by compression-forming a powder of a composite oxide superconducting material such as $YBa_2Cu_3O_x$ to prepare a cylindrical green compact, and firing the thus prepared green compact.

According to the above-mentioned prior art, it is possible to obtain a high magnetic shielding effect under the Meissner effect, i.e., the diamagnetic effect of completely excluding the external magnetism, of the composite oxide superconducting material.

However, the above-mentioned prior art has the following problem: When applying the magnetic shield of the prior art for measurement of bio-magnetism, for example, it is necessary for the magnetic shield to have a large size sufficient to receive a human body. However, when it is attempted to manufacture a large magnetic shield from the composite oxide superconducting material, cracks tend to occur in the large green compact made of the composite oxide superconducting material when firing same. It is therefore very difficult to manufacture a large magnetic shield capable of receiving a human body by the application of the above-mentioned prior art.

SUMMARY OF THE INVENTION

An object of the present invention is therefore to provide a magnetic shield which can easily be scaled up and has a high magnetic shielding effect.

In accordance with one of the features of the present invention, there is provided a magnetic shield characterized by comprising:

a plurality of metallic cylinders connected to each other in the axial direction thereof, each of said plurality of cylinders having at one end thereof an engaging section for receiving an end of an adjacent metallic cylinder to be connected thereto; and a film of a composite oxide superconducting material containing a $Cu_xO_y$-radical, formed on the entire inner surface of each of said plurality of cylinders, including the inner surface of said engaging section thereof.

DETAILED DESCRIPTION OF PREFERRED EMBODIMENTS

From the above-mentioned point of view, extensive studies were carried out to develop a magnetic shield which can easily be scaled up and has a high magnetic shielding effect.

As a result, the following findings were obtained: By connecting a plurality of metallic cylinders to each other in the axial direction thereof, each of which has on the entire surface thereof a film of a composite oxide superconducting material containing a $Cu_xO_y$-radical, it is possible to easily obtain a magnetic shield which is large in size and has a high magnetic shielding effect.

The present invention was made on the basis of the above-mentioned findings. An embodiment of the magnetic shield of the present invention is described below with reference to the drawings.

Figure 1:
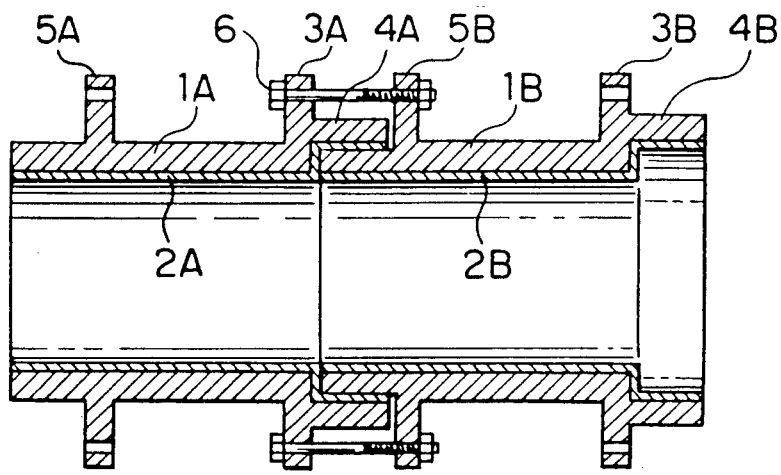
FIG. 1 is a sectional view illustrating an embodiment of the magnetic shield of the present invention.

FIG. 1 is a sectional view illustrating an embodiment of the magnetic shield of the present invention.

As shown in FIG. 1, the magnetic shield of the present invention comprises at least two metallic cylinders 1A and 1B made of a metal such as nickel, each having an identical shape and identical dimensions, which are connected to each other in the axial direction thereof, and films 2A and 2B of a composite oxide superconducting material containing a $Cu_xO_y$-radical, each formed on the entire inner surface of each of the cylinders 1A and 1B. Each of the films 2A and 2B is formed into a uniform thickness throughout the entire inner surface of each of the cylinders 1A and 1B by the known method such as the plasma metallizing.

An engaging section 4A having a first flange 3A is formed at one end of the one cylinder 1A, and an engaging section 4B having a first flange 3B is formed also at one end of the other cylinder 1B. The film 2A of the composite oxide superconducting material containing a $Cu_xO_y$-radical is formed also on the inner surface of the engaging section 4A of the one cylinder 1A, and the film 2B of the composite oxide superconducting material containing a $Cu_xO_y$-radical is formed also on the inner surface of the engaging section 4B of the other cylinder 1B. A second flange 5A is formed at the other end portion of the one cylinder 1A, and a second flange 5B is formed also at the other end portion of the other cylinder 1B.

The two cylinders 1A and 1B are connected to each other in the axial direction thereof, by inserting the other end of the other cylinder 1B into the engaging section 4A of the one cylinder 1A, and tightening the cylinders 1A and 1B to each other by means of a plurality of bolts 6 which are inserted into the first flange 3A of the one cylinder 1A and the second flange 5B of the other cylinder 1B.

According to the magnetic shield of the present invention, having the construction as described above, a magnetic shield having a desired size is easily available by adjusting the inside diameter, the length and the number of the cylinders 1A and 1B to be connected to each other. In addition, since the films 2A and 2B of the composite oxide superconducting material containing a $Cu_xO_y$-radical are formed on the entire inner surfaces of the cylinders 1A and 1B including the inner surfaces of the engaging sections 4A and 4B, a sufficiently high magnetic shielding effect can be obtained not only in the body portions of the cylinders 1A and 1B, but also in the joint portion thereof.

In the magnetic shield of the present invention, an external magnetism may seem to come into the magnetic shield through the open ends thereof. However, if an external magnetism comes into the magnetic shield through the open ends thereof, an induced current is generated in the films 2A and 2B of the superconducting material formed on the inner surfaces of the cylinders 1A and 1B, and this induced current causes magnetism which offsets the external magnetism coming into the magnetic shield. The external magnetism does not therefore come into the magnetic shield although the magnetic shield has the open ends.

Now, the magnetic shield of the present invention is described more in detail by means of examples with reference to the drawings.

EXAMPLE 1

Figure 2:
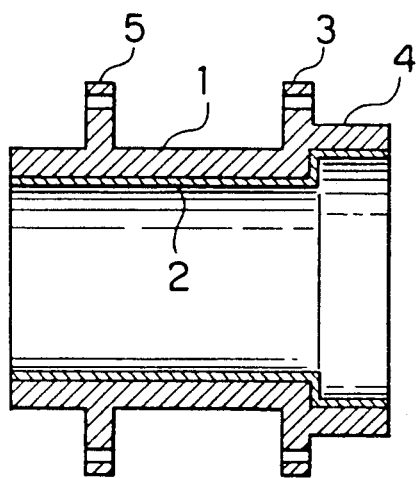
FIG. 2 is a sectional view illustrating a metallic cylinder forming the magnetic shield in the Example 1 of the present invention.

As shown in FIG. 2, a nickel cylinder 1 having at one end thereof an engaging section 4 was prepared, and a film 2 of a composite oxide superconducting material such as $YBa_2Cu_3O_x$, which had a critical temperature of 77 K., was formed into a thickness of 150 μm by the conventional plasma metallizing, throughout the entire inner surface of the cylinder 1 including the inner surface of the engaging section 4 thereof.

The cylinder 1 was made of nickel because nickel is a ferromagnetic material and capable of primarily shielding an external magnetism, and because nickel hardly reacts with the film 2 of the composite oxide superconducting material such as $YBa_2Cu_3O_x$ formed on the inner surface of the cylinder 1 and can thus prevent degradation of the superconducting properties of the film 2.

The cylinder 1 had at one end portion thereof a first flange 3, and at the other end portion thereof a second flange 5, and had dimensions comprising a thickness of 5 mm, an inside diameter of 100 mm, a length of 200 mm, and a length of the engaging section 4 of 30 mm.

Two such cylinders 1, each having the film 2 of the composite oxide superconducting material such as $YBa_2Cu_3O_x$ formed throughout the entire inner surface thereof, were prepared, and the two cylinders 1A and 1B were connected to each other in the axial direction thereof by means of a plurality of bolts 6 as shown in FIG. 1.

The thus prepared magnetic shield was then investigated for a magnetic shielding effect thereof: A magnetometer was placed in the magnetic shield at the center in the axial direction thereof, and the magnetic shield was cooled to a temperature of 77 K. Then, a DC magnetic field of 0.3 Gauss was applied to the magnetic shield from outside in a direction perpendicular to the axis thereof. An intensity of magnetism in the magnetic shield was measured. The magnetometer placed in the magnetic shield showed an intensity of magnetism of $0.1 \times 10^{-3}$ Gauss.

EXAMPLE 2

Figure 3:
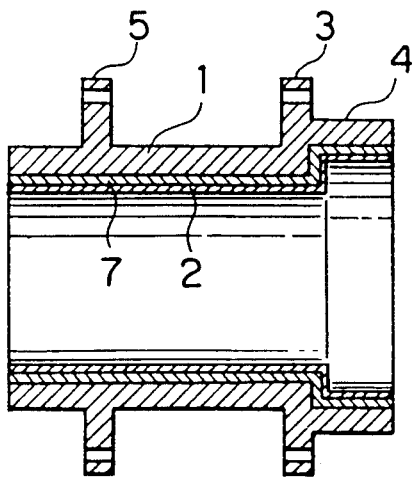
FIG. 3 is a sectional view illustrating a metallic cylinder forming the magnetic shield in the Example 2 of the present invention.

As shown in FIG. 3, a copper cylinder 1 as a substrate, having at end thereof an engaging section 4, was prepared, and then a nickel film 7 having a thickness of 50 μm was formed on the inner surface of the cylinder 1. A film 2 of a composite oxide superconducting material such as $YBa_2Cu_3O_x$, which had a critical temperature of 77 K, was formed into a thickness of 150 μm by the conventional plasma metallizing, throughout the entire inner surface of the cylinder 1 including the inner surface of the engaging section 4 thereof.

The cylinder 1 as the substrate was made of copper because the thermal expansion coefficient of copper, being substantially equal to that of the film 2 of the composite oxide superconducting material such as $YBa_2Cu_3O_x$, makes it difficult for cracks to be produced in the film 2, when forming the film 2 onto the inner surface of the cylinder 1 by the plasma metallizing.

The nickel film 7 was formed on the inner surface of the cylinder 1 as the substrate because, as in the Example 1, nickel hardly reacts with the film 2 of the composite oxide superconducting material such as $YBa_2Cu_3O_x$, unlike copper, and this permits prevention of decrease in the superconducting properties of the film 2.

As in the Example 1, the cylinder 1 had at one end portion thereof a first flange 3, and at the other end portion thereof a second flange 5, and had dimensions comprising a thickness of 5 mm, an inside diameter of 100 mm, a length of 200 mm, and a length of the engaging section 4 of 30 mm.

Two such cylinders 1, each having the film 2 of the composite oxide superconducting material such as $YBa_2Cu_3O_x$ formed throughout the entire inner surface thereof, were prepared, and the two cylinders 1A and 1B were connected to each other in the axial direction thereof by means of a plurality of bolts 6 a shown in FIG. 1.

The thus prepared magnetic shield was then investigated for a magnetic shielding effect thereof: A magnetometer was placed in the magnetic shield at the center in the axial direction thereof, and the magnetic shield was cooled to a temperature of 77 K. Then, a DC magnetic field of 0.3 Gauss was applied to the magnetic shield from outside in a direction perpendicular to the axis thereof. An intensity of magnetism in the magnetic shield was measured. The magnetometer placed in the magnetic shield showed an intensity of magnetism of $0.3 \times 10^{-3}$ Gauss.

The magnetic shielding effect of the magnetic shield of the above-mentioned Example 2 is somewhat inferior to that of the magnetic shield of the above-mentioned Example 1. This is attributable to the fact that the cylinders 1 of the magnetic shield in the Example 1 is made exclusively of nickel which is a ferromagnetic material and the primary shielding effect of the external magnetism by these cylinders 1 is fully displayed.

As is clear from the above-mentioned Examples 1 and 2, use of the magnetic shield of the present invention permits considerable reduction of the external magnetism. More particularly, since geomagnetism has an intensity of approximately 0.3 Gauss, use of the magnetic shield of the present invention permits reduction of geomagnetism to approximately a thousandth.

Therefore, it is possible, by using the magnetic shield of the present invention, to detect bio-magnetism at a very high accuracy by means of a bio-magnetism meter using a SQUID (the abbreviation of Superconducting Quantum Interference Device).

According to the magnetic shield of the present invention, as described above in detail, it is possible to easily scale up the magnetic shield and obtain a high magnetic shielding effect, thus providing industrially useful effects.

What is claimed is:
1. A magnetic shield characterized by comprising:
   a plurality of metallic cylinders connected to each other in the axial direction thereof, each of said plurality of cylinders having at one end thereof an engaging section for receiving an end of an adjacent metallic cylinder to be connected thereto; and
   a film of a composite oxide superconducting material containing a $Cu_xO_y$-radical, formed on the entire inner surface of each of said plurality of cylinders, including the inner surface of said engaging section thereof.
2. A magnetic shield as claimed in claim 1, wherein: each of said plurality of metallic cylinders is made of nickel or a nickel alloy.
3. A magnetic shield as claimed in claim 1, wherein: each of said plurality of metallic cylinders comprises a cylindrical copper substrate and a film of nickel or a nickel alloy formed on the entire inner surface of said cylindrical substrate.

* * * * *

UNITED STATES PATENT AND TRADEMARK OFFICE
CERTIFICATE OF CORRECTION

PATENT NO.  : 5,061,685
DATED       : October 29, 1991
INVENTOR(S) : KOSUGE et al It is certified that error appears in the above-identified patent and that said Letters Patent is hereby corrected as shown below:

Title page, Section [73] Assignee:

Delete "Kitagawa Industries Co., Ltd., Nagoya, Japan" and replace with

--NKK Corporation
     Tokyo, Japan--

Signed and Sealed this

Twenty-second Day of June, 1993

Attest:

MICHAEL K. KIRK

*Attesting Officer*     *Acting Commissioner of Patents and Trademarks*